United States Patent
Lai et al.

(10) Patent No.: US 7,718,989 B2
(45) Date of Patent: May 18, 2010

(54) RESISTOR RANDOM ACCESS MEMORY CELL DEVICE

(75) Inventors: Erh-Kun Lai, Longjing Shiang (TW); ChiaHua Ho, Kaoshing (TW); Kuang Yeu Hsieh, Ju Bai (TW)

(73) Assignee: Macronix International Co., Ltd., Hsinchu (TW)

( * ) Notice: Subject to any disclaimer, the term of this patent is extended or adjusted under 35 U.S.C. 154(b) by 139 days.

(21) Appl. No.: 11/617,542

(22) Filed: Dec. 28, 2006

(65) Prior Publication Data

US 2008/0157053 A1    Jul. 3, 2008

(51) Int. Cl.
*H01L 29/02*    (2006.01)
(52) U.S. Cl. .................. 257/2; 257/379; 365/148; 365/185.08; 711/102; 711/103; 430/311; 430/313; 430/314; 430/316; 430/317; 438/106
(58) Field of Classification Search .............. 257/2, 257/379, E21.662, E21.663, E21.665, E21.679, 257/E45.002; 365/148, 185.08; 711/102, 711/103; 430/311, 313, 314, 316, 317, 106
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Lynne A Gurley
*Assistant Examiner*—Meiya Li
(74) *Attorney, Agent, or Firm*—Haynes Beffel & Wolfeld LLP

(57) ABSTRACT

A memory cell device has a bottom electrode and a top electrode, a plug of memory material in contact with the bottom electrode, and a cup-shaped conductive member having a rim that contacts the top electrode and an opening in the bottom that contacts the memory material. Accordingly, the conductive path in the memory cells passes from the top electrode through the conductive cup-shaped member, and through the plug of phase change material to the bottom electrode. Also, methods for making the memory cell device include steps of forming a bottom electrode island including an insulative element and a stop element over a bottom electrode, forming a separation layer surrounding the island, removing the stop element to form a hole over the insulative element in the separation layer, forming a conductive film in the hole and an insulative liner over conductive film, etching to form a cup-shaped conductive film having a rim and to form an opening through the insulative liner and the bottom of the cup-shaped conductive film to the surface of the bottom electrode, forming a plug of phase change memory material in the opening, and forming a top electrode in contact with the rim of the cup-shaped conductive film.

19 Claims, 9 Drawing Sheets

U.S. PATENT DOCUMENTS

| | | |
|---|---|---|
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Hoppe et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 * | 7/2003 | Lowrey .................. 257/3 |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0248339 A1 | 12/2004 | Lung |
| 2005/0029502 A1 | 2/2005 | Hudgens |
| 2005/0029503 A1 * | 2/2005 | Johnson ...................... 257/4 |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0049447 A1 * | 3/2006 | Lee et al. .................... 257/314 |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1 * | 10/2006 | Burr et al. .................... 257/2 |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0037101 A1 | 2/2007 | Morioka |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |

| | | | |
|---|---|---|---|
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |
| 2007/0176261 A1 | 8/2007 | Lung | |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost,", Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n. Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

"Optimized Thermal Capacitance in a Phase Change Memory Cell Design", IPCOM000141986D, IP.com Prior Art Database, Oct. 18, 2006, 4 pp.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Thermal Conductivity of Crystalline Dielectrics" in CRC Handbook of Chemistry and Physics, Internet Version 2007, (87th edition), David R. Lide, ed. Taylor and Francis, Boca Raton, FL.

* cited by examiner

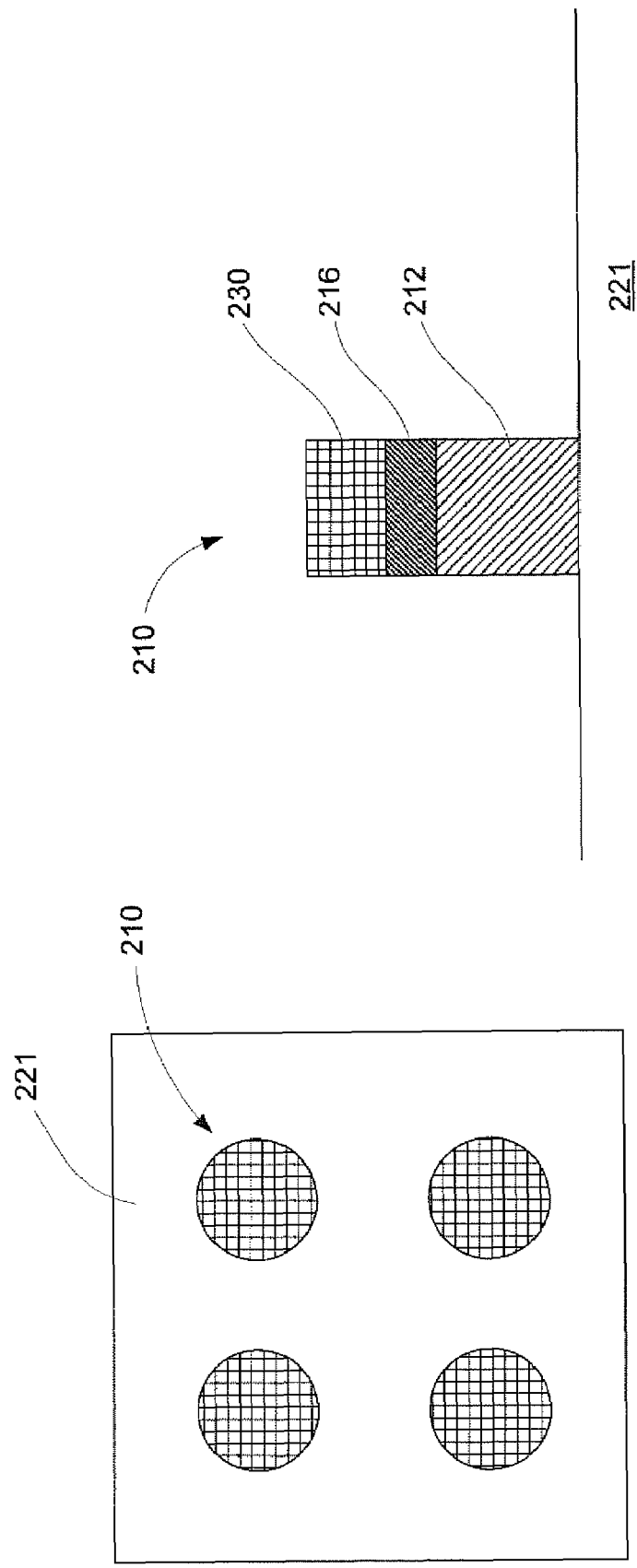

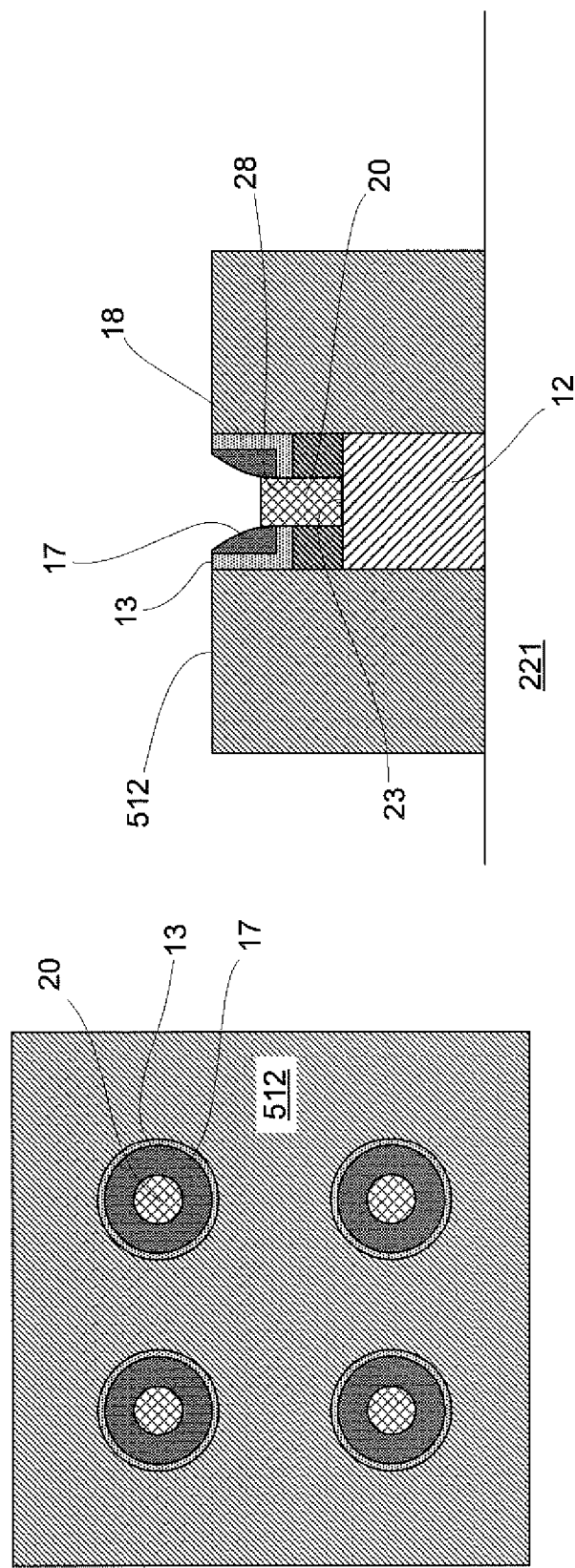

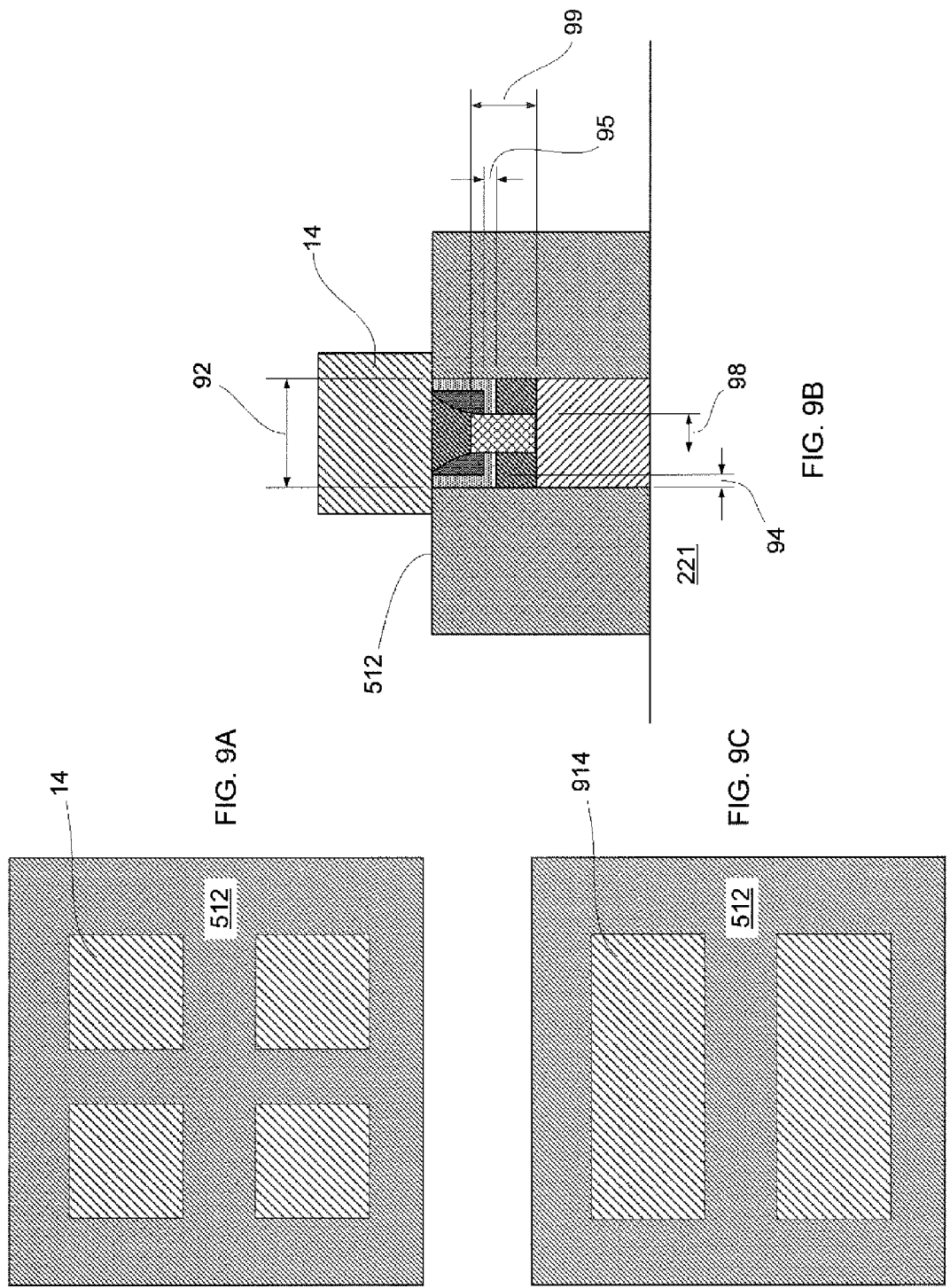

RESISTOR RANDOM ACCESS MEMORY CELL DEVICE

BACKGROUND

1. Field of the Invention

This invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al, "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY

Generally, the invention features a memory cell device of the type that includes a memory material switchable between electrical property states by application of energy. The memory cell device has a bottom electrode and a top electrode, a plug of memory material in contact with the bottom electrode, and a cup-shaped conductive member having a rim that contacts the top electrode and an opening in the bottom that contacts the memory material. Accordingly, the conductive path in the memory cells passes from the top electrode through the conductive cup-shaped member, and through the plug of phase change material to the bottom electrode.

In one general aspect the invention features a memory cell device including a bottom electrode and a top electrode, a plug of memory material in contact with the bottom electrode, and a cup-shaped conductive member having a rim in contact with the top electrode and having an opening in the bottom in contact with the memory material.

In another general aspect the invention features a method for making a memory cell device, by: providing a substrate having an intermetal dielectric at a surface, forming a first electrode layer over the intermetal dielectric, forming an electrically insulative layer over the first electrode layer, forming a stop layer over the electrically insulative layer, and patterning the layers to form bottom electrode islands each including an electrically insulative element and a stop element; depositing a fill material over the intermetal dielectric and the islands; removing the fill material to the stop element; removing the stop element, forming a hole defined by a wall of the separation layer and an exposed surface of the electrically insulative element; depositing an electrically conductive material to form an electrically conductive film over the fill material, the wall of the separation layer and the exposed surface of the electrically insulative element; depositing an electrically insulative liner material over the electrically conductive film; performing an anisotropic etch to remove the insulative liner material and the conductive film from the surface of the separation layer and to form an opening through the insulative liner material and through the conductive film; depositing a phase change memory material into the opening; forming an oxide cap over the phase change memory material; and forming a top electrode over the oxide cap and surface of the separation layer.

The method according to the invention is a straightforward self-aligned process, and is readily scalable.

In the resulting memory cell construct the memory material is in electrical contact with a bottom electrode. A conductive member includes a sidewall having a rim and a bottom having an opening. The memory material contacts the bottom electrode and contacts the conductive member at the opening; and the rim of the cup-shaped member contacts the top electrode.

BRIEF DESCRIPTION OF THE DRAWINGS

FIGS. 2A and 2B are diagrammatic sketches in plan and a sectional views, respectively, showing a patterned bottom electrode stack, including bottom electrode, oxide, and silicon nitride layers, on a surface of an intermetal dielectric.

FIGS. 7A and 7B are diagrammatic sketches in plan and a sectional views, respectively, showing the result of depositing a GST layer over the structure of FIGS. 6A, 6B, and etching back to form a GST plug.

FIGS. 9A and 9B are diagrammatic sketches in plan and a sectional views, respectively, showing the result of forming a top electrode over the structure of FIGS. 8A, 8B, and marked to illustrate dimensions of some features of the completed memory cell.

FIG. 9C is a diagrammatic sketch in a plan view as in FIG. 9A showing an alternative form of top electrode.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
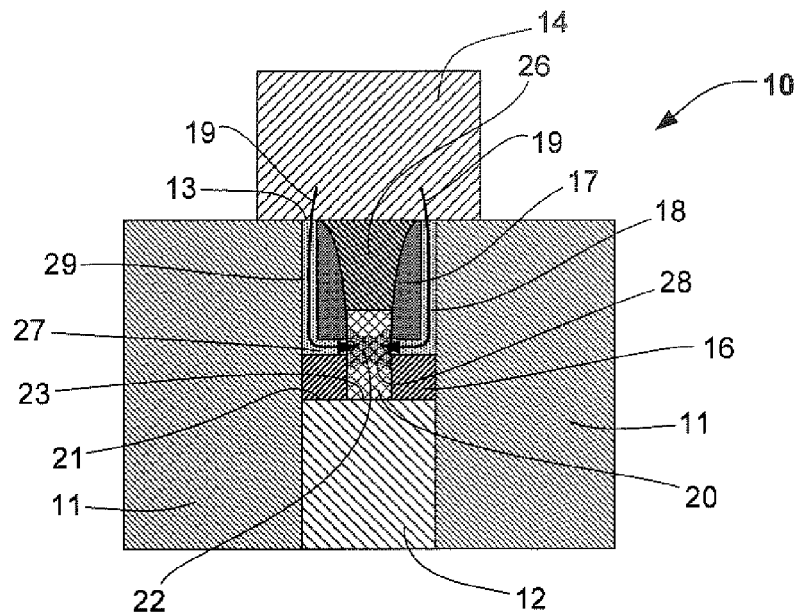
FIG. 1 is a diagrammatic sketch in a sectional view showing a memory cell device according to an embodiment of the invention.

Turning now to FIG. 1, there is shown generally at 10 a memory cell structure according to an embodiment of the invention. Memory cell structure 10 includes a bottom electrode 12 and a top electrode 14. An electrically insulative layer 16 overlies the bottom electrode 12. An electrically conductive cup-shaped liner 18 includes a bottom part 27 formed over the insulative layer 16 and a side wall part 29 having a rim 13 which contacts the top electrode 14. An electrically insulative liner 17 is formed over the bottom part 27 and within the side wall part 29 of the conductive cup-shaped liner 18. A plug 20 of a phase change memory material is formed within an opening through the insulative liner 17, the bottom part 27 of the conductive cup-shaped liner 18, and the insulative layer 16. The plug 20 of phase change memory material contacts a portion 23 of the surface 21 of the bottom electrode 12, and contacts the conductive cap-shaped liner 18 at the opening 28 through the bottom part 27. An electrically insulative cap 26 fills the volume within the insulative liner 17 and between the top electrode 14 and the plug 20 of phase change material. The bottom electrode 12, the insulative layer 16 and the conductive cup-shaped liner 18, together with plug 20 of phase change material and the remainder of the features contained within the cup-shaped liner, are enclosed by a fill layer or separation layer 11. The fill layer 11 and the bottom electrode 12 rest upon an intermetal dielectric; and the top electrode 14 rests upon the fill layer 11, and contacts the rim 13 of the conductive cup-shaped liner 18. Thus, the top electrode is electrically connected to the cup-shaped liner at the rim of the side wall of the cup-shaped liner; the plug of phase change material is electrically connected to the bottom electrode at a portion of the surface of the bottom electrode; and the cup-shaped liner is electrically connected to the plug of phase change material at the opening of the bottom of the cup-shaped liner. The conductive path, illustrated roughly by arrows 19, passes from the top electrode 14 through the conductive cup-shaped liner 18, through the plug 20 of phase change material to the bottom electrode 12.

This memory cell structure according to the invention provides several advantageous features, as FIG. 1 shows. The plug of phase change material has a small area of contact with the bottom electrode. The current flow from the top electrode (by way of the cup-shaped liner) to the plug of phase change material is confined to a small area where the opening through the bottom part of the cup-shaped liner contacts the phase change material.

Figure 10:
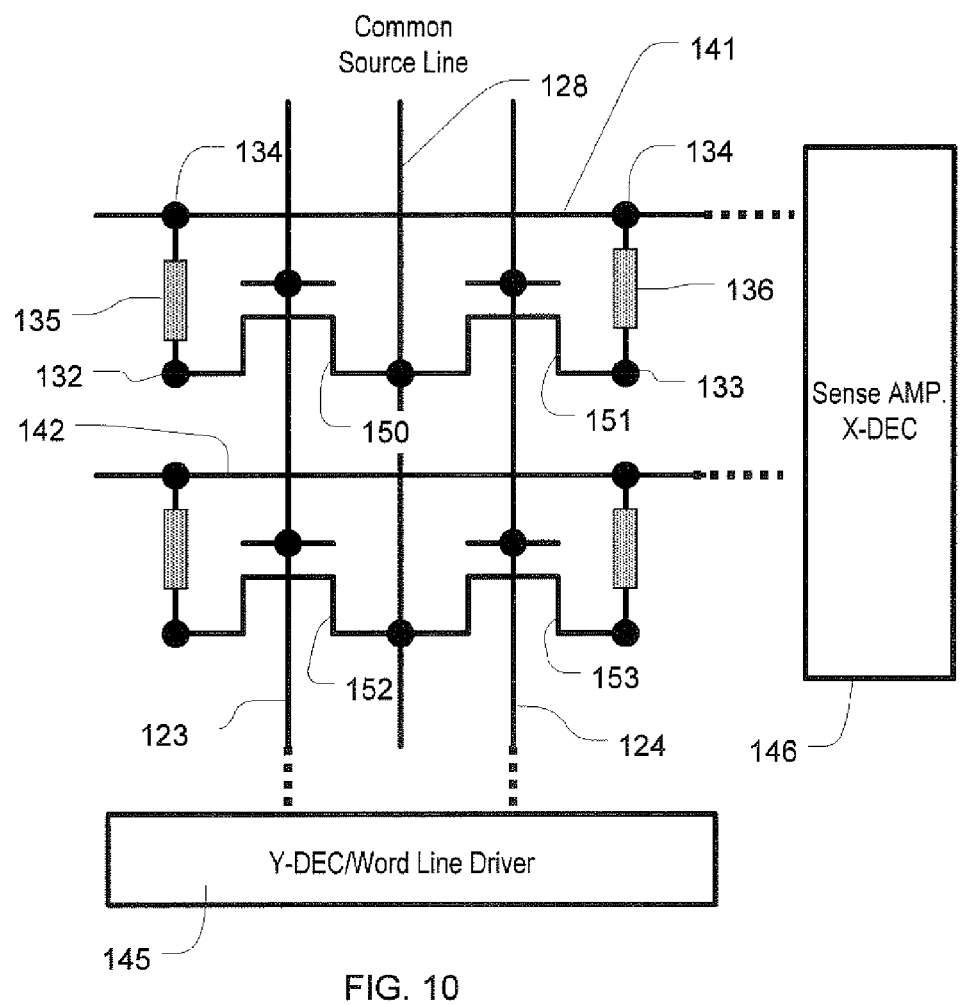
FIG. 10 is a schematic diagram for a memory array comprising phase change memory elements.
Figure 3B:
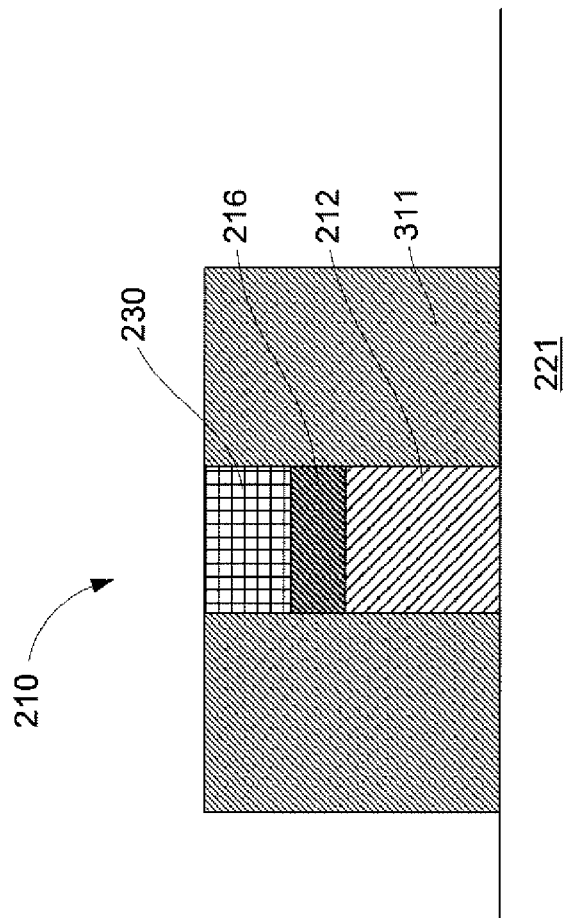
FIGS. 3A and 3B are diagrammatic sketches in plan and a sectional views, respectively, showing the result of depositing and polishing a fill around a stack as in FIGS. 2A, 2B, FIGS. 4A and 4B are diagrammatic sketches in plan and a sectional views, respectively, showing the result of removing the silicon nitride layer from the stack.
Figure 3A:
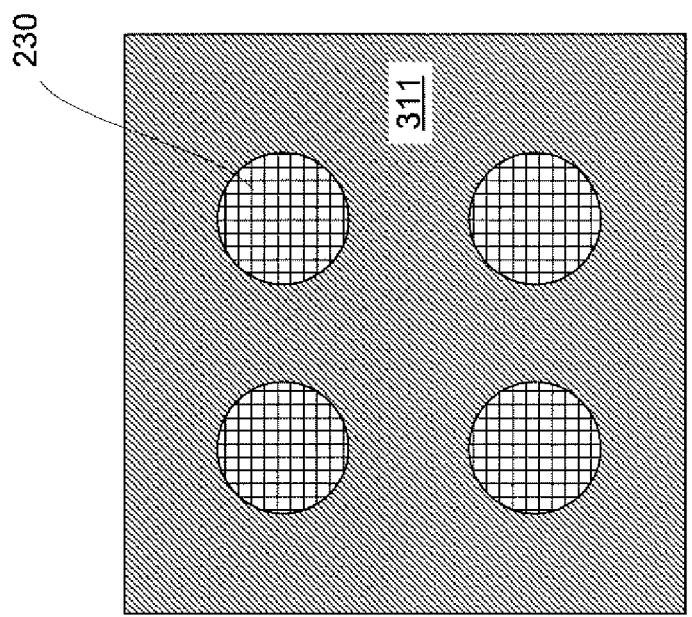

FIG. 10 is a schematic illustration of a memory array, which can be implemented as described herein. In the schematic illustration of FIG. 10, a common source line 128, a word line 123 and a word line 124 are arranged generally parallel in the Y-direction. Bit lines 141 and 142 are arranged generally parallel in the X-direction. Thus, a Y-decoder and a word line driver in block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123, The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for memory cell 135, which has top electrode member 134. The top electrode member 134 is coupled to the bit line 141. Likewise, the drain of access transistor 151 is coupled to the bottom electrode member 133 for memory cell 136, which has top electrode member 137. The top electrode member 137 is coupled to the bit line 141. Access transistors 152 and 153 are coupled to corresponding memory cells as well on bit line 142. It can be seen that in this illustrative configuration the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Embodiments of memory cell device 10 include phase change based memory materials, including chalcogenide based materials and other materials, for memory material 20. Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In the disclosure herein, the phase change material is referred to as GST, and it will be understood that other types of phase change materials can be used. A material useful for implementation of a memory device described herein is $Ge_2Sb_2Te_5$.

With reference again to FIG. 1, access circuitry, such as described with reference to FIG. 10, can be implemented to contact the first electrode 12 and the second electrode 14 in a variety of configurations for controlling the operation of the memory cell, so that it can be programmed to set the phase change material 20 in one of the two solid phases that can be reversibly implemented using the memory material. For example, using a chalcogenide-based phase change memory material, the memory cell may be set to a relatively high resistivity state in which at least a portion of the bridge in the current path is an amorphous state, and a relatively low resistivity state in which most of the bridge in the current path is in a crystalline state. For example, application of an electrical pulse having a suitable shorter, high amplitude profile, for example, results in changing the phase change material 20 locally to a generally amorphous state, as indicated at 22 in FIG. 1.

Manufacture of a memory cell device 10 will be described with reference to FIGS. 2A-9C, in which various stages in an exemplary process are shown in plan view (2A, 3A, etc.; an array of four memory cells is shown) and in sectional view (2B, 3B, etc.; one memory cell is shown). Access circuitry is provided in a substrate having a surface intermetallic dielectric layer 221. An electrically conductive layer of a conductive material suitable for a bottom electrode, such as a metal or metal-based or non-metal material, such as, e.g.: copper; aluminum; titanium (Ti) and titanium-based materials such as titanium nitride (TiN), titanium ox nitride (Ton); tantalum (Ta) and tantalum-based materials such as tantalum nitride (Tan); polysilicon, tungsten-based materials such as tungsten silicide ($WSi_x$); and, for a low thermal conductivity electrode, materials such as LNO ($LaNiO3$) and LSMO ($LaSrMnO_3$), is deposited on the surface of the intermetallic dielectric layer 221; an electrically insulative layer, such as an oxide (e.g., silicon dioxide) is deposited over the bottom electrode layer; and an etch stop layer, of a material such as silicon oxynitride or silicon nitride, is deposited over the insulative layer.

The bottom electrode layer may have a thickness, for example, in a range about 200 Å to about 3000 Å, usually about 500 Å. An oxide insulative layer, for example, may have a thickness in a range about 50 Å to about 2000 Å, such as about 200 Å for a silicon dioxide layer. A silicon nitride etch stop layer, for example, may have a thickness in a range about 200 Å to about 3000 Å, usually about 1000 Å. The layers are then patterned and etched to form bottom electrode stacks or islands 210, each including a bottom electrode 212, an insulative layer (oxide, such as silicon dioxide) 216, and an etch stop layer 230, as shown for example in FIGS. 2A, 2B. Layer 230 is a sacrificial layer, of a material selected according to the materials of the insulative layer 216 and the fill layer 311 (see below); generally a suitable material for the layer 230 has a higher etch selectivity to insulative layer 216 and a higher CMP selectivity to layer 311. Accordingly, polysilicon or tungsten materials are suitable for most insulative layer materials and conductive layers. In plan view (FIG. 2A) the bottom electrode stack is shown here as having been patterned to be a cylindrical island; other shapes may be formed by patterns having different configurations. Alternatively, a cross-point configuration (bit-line/word line) could be employed, as illustrated diagrammatically in FIG. 10.

Then a fill material is deposited over the structure of FIGS. 2A and 2B, and the material is removed back to the surface of the etch stop layer 230, to form a fill layer (or separation layer) 311. Suitable fill materials include, for example, oxides (e.g., silicon dioxide BPSG, FSG lower K, or other material having higher etch selectivity to layer 230), and nitrides (e.g., silicon nitride, silicon oxynitride polysilicon, tungsten, or some other material having higher etch selectivity to layer 216 and a higher CMP rate to layer 311). The fill material surrounds the bottom electrode stacks, and preferably provides a relatively good insulator for heat as well as for electricity, providing thermal and electrical isolation for the memory cells. The fill material may be planarized by chemical mechanical polishing, or by etch back, for example, and exposure of the surface of the etch stop layer 230 may be detected to terminate the polish or etch. The fill material may be deposited by high density plasma chemical vapor deposition, for example, and, in this process the etch stop is protective. Suitable etch stop materials include for example, silicon oxynitride (SiON), tungsten (W), polysilicon, or other material having a higher etch selectivity to insulative layer 216 and a higher CMP rate to layer 311; and the etch stop layer has a thickness, for example, in a range about 200 Å to about 3000 Å, usually about 1000 Å.

Then the etch stop layer is removed, for example by a selective ion etch or by a wet etch ("dip"). This results in the structure shown in FIGS. 4A and 4B. The separation layer 311 encloses the bottom electrode 212 and the insulative (oxide) layer 216 generally as in the previous FIGs. Now, however, a surface 421 of the insulative (oxide) layer 216 is exposed at the bottom of a hole 422 defined by the surrounding wall 421 of the separation layer.

Figure 4B:
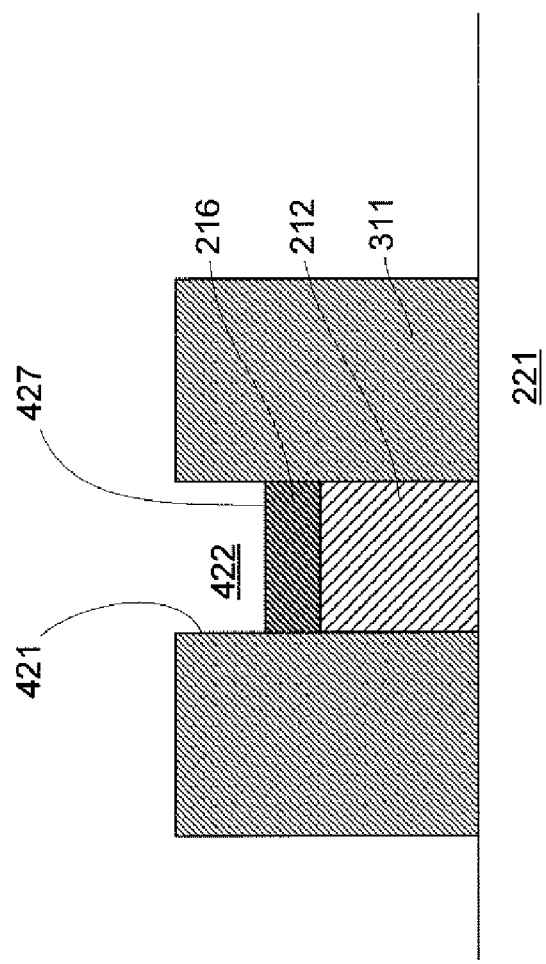
Figure 4A:
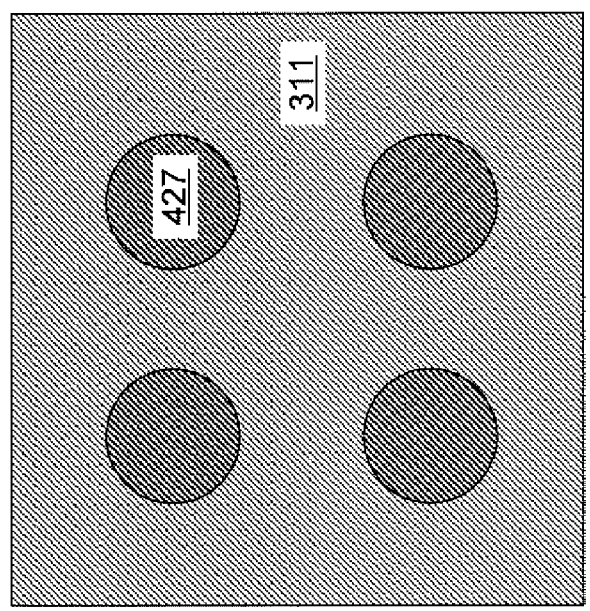
Figure 5B:
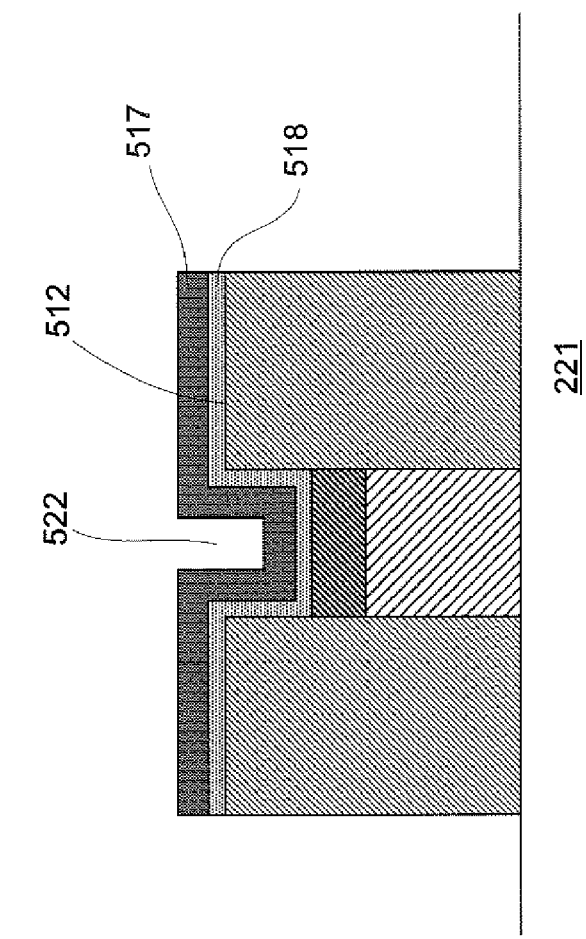
FIGS. 5A and 5B are diagrammatic sketches in plan and a sectional views, respectively, showing the result of depositing a layer of titanium nitride over the structure of FIGS. 4A, 4B, and forming a liner layer of silicon dioxide over the titanium nitride layer.
Figure 5A:
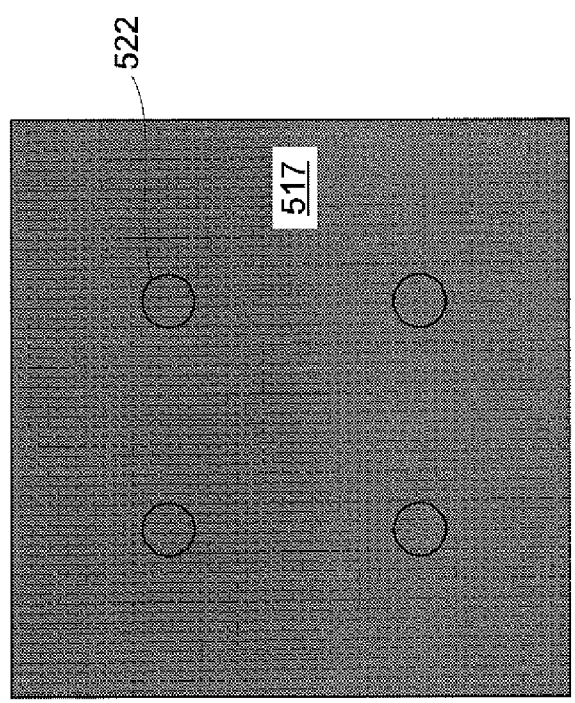

Then an electrically conductive material is deposited over the structure shown in FIGS. 4A, 4B, forming an electrically conductive film 518 on the top surface of the separation layer, the surface 427 of the insulative (oxide) layer 216, and the surface of the wall 421. Then an electrically insulative material is deposited over the structure, to form a liner layer 517 over the surface of the electrically conductive film 618. The result of these procedures is shown in FIGS. 5A and 5B. The thickness of the liner layer is limited so that it does not entirely fill the volume in the hole, leaving a void 522. Suitable materials for the electrically conductive film include, for example, titanium nitride, TI, W, Cu, polysilicon; titanium nitride may be preferred as a liner material because thinner layers of TiN can be effective. Suitable materials for the insulative (oxide) liner layer include, for example, silicon oxynitride (SiON) and silicon nitride (SiN).

Figure 6B:
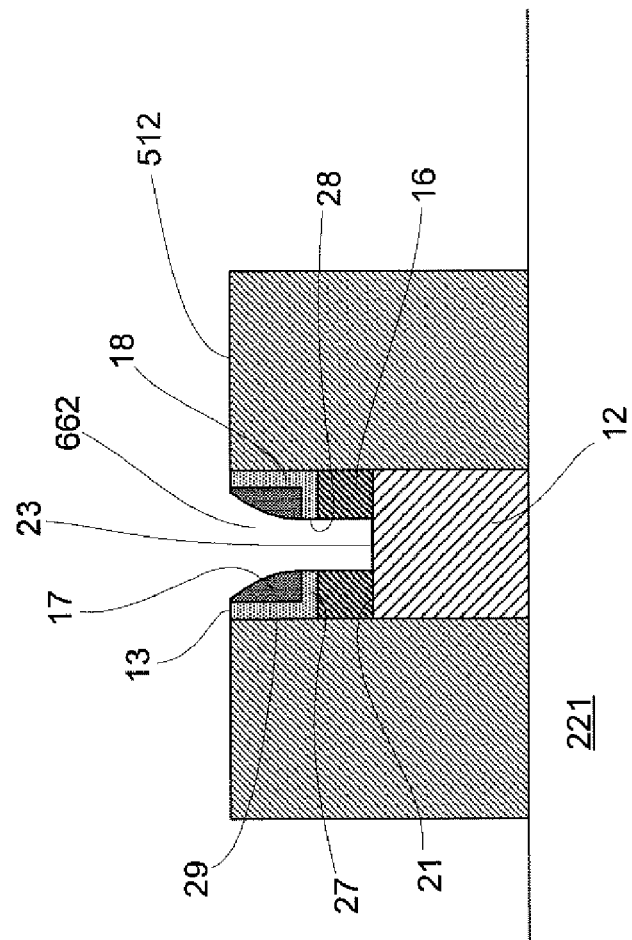
FIGS. 6A and 6B are diagrammatic sketches in plan and a sectional views, respectively, showing the result of anisotropically etching through the silicon dioxide and the titanium nitride to expose an area of the bottom electrode.
Figure 6A:
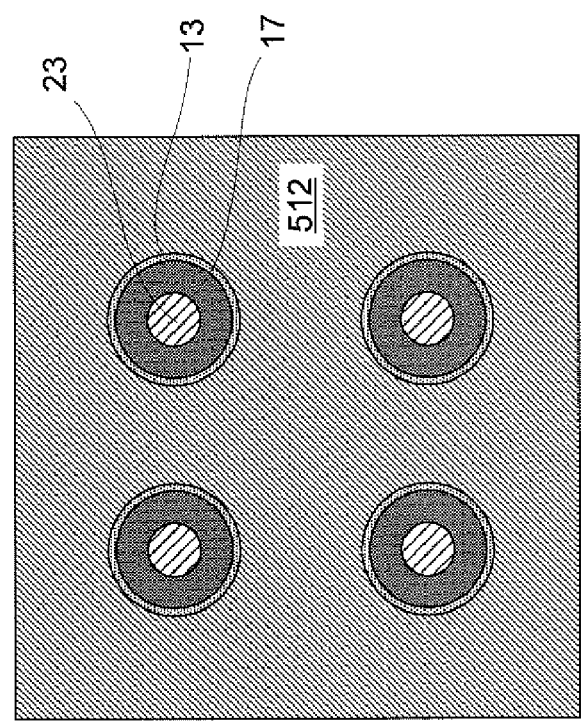

Then an anisotropic etch is preformed, to remove the insulative liner material and the conductive film material from the surface of the separation layer, and to etch through the insulative (oxide) liner material and through the conductive film at the bottom of the hole. As shown in FIGS. 6A, 6B, this results in formation of the electrically conductive film 518 as a cup-shaped conductive liner 18, and it also results in formation of an opening 622 passing to the bottom electrode 12 and exposing several features, including: the surface 512 of the separation layer 311, the rim 13 of the cup-shaped liner 18, a small area 23 of the surface 21 of the bottom electrode 12, and the opening 28 through the bottom part 27 of the cup-shaped liner 18. A portion of the insulative liner material remains, over the bottom part 27 and within the side wall part 29 of the cup-shaped liner 18.

A suitable anisotropic etch may include several steps, and an example employing three steps follows. In this example the insulative liner 517 (17) is SiN, the electrically conductive film 518 (18) is a metal such as copper, and the insulative layer 216 (16) is silicon oxide. In the first step, for SiN, a reactive ion etch (RIE) is performed, using a higher bottom power of, for example, 80-200 W and chemistries such as $CH_3F$ or $CHF_3$ or a mixture of $CH_3F$ and $CHF_3$, optionally with one of, or a mixture of two or all of, argon, nitrogen, and oxygen. In the second step, for the metal, a chlorine-based etch is performed, such as a RIE using chemistries of $BCl_3$ or $Cl_2$ or a mixture of $BCl_3$ and $Cl_2$, optionally with argon or nitrogen or a mixture of argon and nitrogen. As in the first step, in the second step the bottom power is high enough to perform anisotropic etch, for example higher than 100 W for an 8" wafer process. The second step etch can be stopped by time control or by end point detection; for end point detection C—N signal degradation can be employed to detect the TiN etching process. In the third step, for $SiO_2$, a RIE is performed, using chemistries such as $C_4F_8$ or $CF_4$ or $CHF_3$ or $C_4F_6$ or a mixture of one or more of $C_4F_8$, $CF_4$, $CHF_3$, and $C_4F_6$, optionally with oxygen or argon or a mixture of oxygen and argon. The selectivity of the third layer, (here $SiO_2$) to the first layer (here SiN) is high to prevent damage to the SiN layer during the third etch step; the etch selectivity may be higher than about 10, for example. Parameters of the etch steps may be adjusted or tuned as a matter of routine to obtain optimum performance and to optimize the physical profile of the resulting etch. An $O_2$ plasma strip may be performed between the second and third steps, to remove polymer residue within the hole. Optionally an additional dry strip can be performed following each of the three steps and following the conventional $O_2$ plasma strip.

Then the phase change memory material is deposited over the structure shown in FIGS. 6A, 6B, and the upper portion of the deposited material is removed, for example by etch back, to leave a plug 20 of the phase change material in the lower part of the opening 622 as shown in FIGS. 7A and 7B. The phase change memory material may be a chalcogenide of the formula GexSbyTez (a "GST"), where x=0-5; y=0-5; and z=0-10, such as, for example, a GST where x:y:z=2:2:5. Or the phase change material may be a GST, such as for example, a N-doped GST or a Si-doped GST, or a Ti-doped GST; or another element may be employed as a dopant.

The chalcogenide phase change memory material is deposited by PVD sputtering or by magnetron-sputtering, using argon, nitrogen, helium or the like or mixtures of such gases as reactive gases, at pressure in the range about 1 mtorr to about 100 mtorr, and usually at room temperature. Fill-in performance can be improved by using a collimator with an aspect ratio of about 1 to about 5, or by employing a DC bias in the range about 10 V to about 1000 V (such as several tens of volts to several hundred volts), or by a concurrent use of both a collimator and a DC bias. Following deposition the chalcogenide material may be annealed to improve the crystalline state. The post deposition anneal can be done, for example, under vacuum or nitrogen ambient, at temperatures in the range about 100° C. to about 400° C. for a time less than 30 minutes.

The thickness of the chalcogenide plug depends upon the design of the cell structure. Generally a chalcogenide plug having a thickness greater than about 8 nm can show a phase change characteristic with bistable resistance. The deposited chalcogenide material can be etched back using a conventional metal-dry-etch recipe, that is, a RIE using chemistries such as $Cl_2$ or $CF_4$ or a mixture of $Cl_2$ and $CF_4$, optionally with argon or oxygen or a mixture of argon and oxygen. In order to remove GST outside the hole, an anisotropic GST etch is needed. The RIE should have additional bottom power, such as for example 40-100 W, to form the structure shown in FIG. 7B. End point detection can be used to stop the GST etch.

Where the memory materials is deposited by sputtering, the conditions may include, for example, nitrogen or argon gas (or a mixture of argon and nitrogen); the target may be GeSbTe if only argon gas is used, or, if $Ar/N_2$ gas is used, the target may be $N_2$—GeSbTe.

The etch back is controlled so that the contact of the phase change memory material with the cup-shaped liner at the opening 28 is maintained. The plug of phase change memory material contacts the bottom electrode at the small area 23, and it contacts the cup-shaped conductive film 18 at the opening 28. The plug is confined by the lower part of the opening 622, and the shape and dimensions of the plug—including the area 23 of contact of the plug with the bottom electrode—are defined by the shape and dimensions of the lower part of the opening 622 and by the height of the plug as remains following the etch back.

Then an oxide material (such as silicon dioxide) is deposited over the structure of FIGS. 7A, 7B, filling the volume within portion of the opening 622 remaining over the plug 20, and the oxide material is planarized to form a cap oxide 26.

Figure 8B:
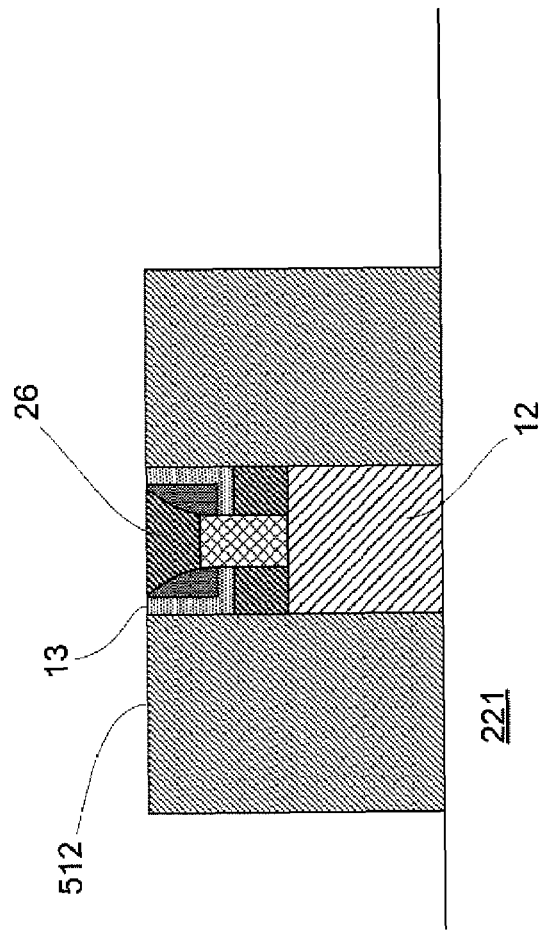
FIGS. 8A and 8B are diagrammatic sketches in plan and a sectional views, respectively, showing the result of depositing a cap oxide over the structure of FIGS. 7A, 7B, and planarizing.
Figure 8A:
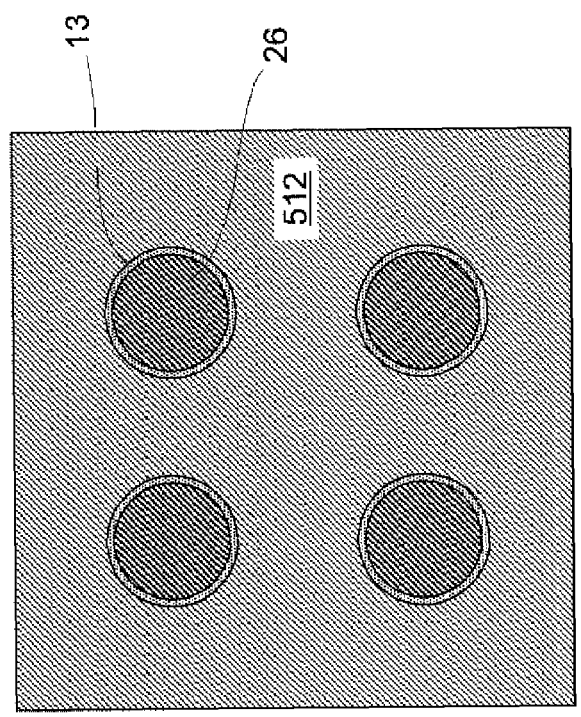

Then an electrically conductive material suitable for a top electrode, such as a metal or metal-based or non-metal material, such as, e.g.: copper; aluminum; titanium (Ti) and titanium-based materials such as titanium nitride (TiN), titanium oxynitride (TiON); tantalum (Ta) and tantalum-based materials such as tantalum nitride (TaN); polysilicon, tungsten-based materials such as tungsten silicide ($WSi_x$); and, for a low thermal conductivity electrode, materials such as LNO ($LaNiO_3$) and LSMO ($LaSrMnO_3$), is deposited over the structure of FIGS. 8A, 8B, and is patterned to form top electrodes over the memory cell components, as shown in FIGS. 9A, 9B, and 9C. The top electrode may be patterned as islands, as shown for example in FIG. 9A, or as lines (straplines or bitline), as shown for example in FIG. 9C. The top electrode may have a thickness, for example, in a range about 200 Å to about 5000 Å, usually about 2000 Å.

The resulting memory cell device is shown at FIG. 9B, marked to indicate dimensions of some features. Generally the cross-sectional shape of the features in the memory cell made according to the invention are defined by the shape of the hole in the separation layer, which in turn may be defined by the shape of the memory stack or island. Similarly, the shape and dimensions of the plug of phase change material are defined by the shape and dimensions of the opening formed by the anisotropic etch, and by the extent of etchback of the phase change material. In the illustrated embodiments various of the features of the memory cell are shown as having a circular cross-section (in the plane of the surface of the intermetallic dielectric), but as will be understood other cross-sectional shapes may be used. Certain of the dimensions shown by way of example with reference to FIG. 9B may be termed "widths", with the understanding that where the feature is circular, a diameter is meant.

The width 92 of the hole through the separation layer may be in a range about 50 nm to about 400 nm, usually about 100 nm. The thickness 94 of the side wall portions of the cup-shaped conductive film may be in a range about 25 Å to about 200 Å, usually about 50 Å, and the thickness 95 of the bottom potion of the cup-shaped conductive film may be in a range about 25 Å to about 200 Å, usually about 50 Å. The width 98 of the area of contact of the plug with the bottom electrode may be in a range about 20 nm to about 260 nm, usually about 70 nm providing a contact area in a range about 20 nm to about 260 nm, usually about 70 nm. The height 99 of the plug depends among other factors upon the thickness 95 of the bottom portion of the cup-shaped conductive film and the thickness of the insulative oxide between the contact area at the bottom electrode; the height 99 may be in a range about 20 nm to about 100 nm, usually about 30 nm.

Embodiments of memory cell device 10 include phase change based memory materials, including chalcogenide based materials and other materials, for memory material 20. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v. 3109, pp. 28-37(1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—$SrTiO_3$, Ag—GeTe, PrCaMnO, ZnO, $Nb_2O_5$, Cr—$SrTiO_3$.

For additional information on the manufacture, component materials, use and operation of phase change random access memory devices, see U.S. patent application Ser. No. 11/155,067, filed 17 Jun. 2005, titled Thin Film Fuse Phase Change Ram And Manufacturing Method.

Other embodiments are within the scope of the invention.

What is claimed is:

1. A memory cell device, comprising a bottom electrode and a top electrode, a plug of memory material in contact with the bottom electrode, and a cup-shaped electrically conductive member having a rim and a bottom having an opening therein, wherein the electrically conductive member is in contact with the top electrode at the rim and wherein the electrically conductive member is in contact with the memory material at the opening.

2. The memory cell device of claim 1 wherein the electrically conductive member has a thickness at the rim in a range about 25 Å to about 200 Å.

3. The memory cell device of claim 1 wherein the electrically conductive member has a thickness at the rim about 50 Å.

4. The memory cell device of claim 1 wherein the electrically conductive member has a thickness at the contact with the memory material in a range about 25 Å to about 200 Å.

5. The memory cell device of claim 1 wherein the electrically conductive member has a thickness at the contact with the memory material about 50 Å.

6. The memory cell device of claim 1 wherein an area of contact of the memory material with the bottom electrode has a width in a range about 20 nm to about 260 nm.

7. The memory cell device of claim 6 wherein an area of contact of the memory material with the bottom electrode has a width about 70 nm.

8. The memory cell device of claim 1 wherein the plug of memory material has a height in a range about 20 nm to about 100 nm.

9. The memory cell device of claim 8 wherein the plug of memory material has a height about 30 nm.

10. The memory cell device of claim 1 wherein the memory material comprises a phase change based memory material.

11. The memory cell device of claim 10 wherein the memory material comprises a chalcogenide based material.

12. The memory cell device of claim 10 wherein the memory material comprises an at least bistable alloy.

13. The memory cell device of claim 11 wherein the memory material comprises a GST material.

14. The memory cell device of claim 11 wherein the memory material comprises a chalcogenide of the formula $Ge_xSb_yTe_z$, where $0 \leq x \leq 5$; $0 \leq y \leq 5$; and $0 \leq z \leq 10$.

15. The memory cell material of claim 14, where x:y:z=2:2:5.

16. The memory cell device of claim 11 wherein the memory material comprises a doped GST.

17. The memory cell device of claim 16 wherein the memory material comprises a N-doped GST.

18. The memory cell device of claim 16 wherein the memory material comprises a Si-doped GST.

19. The memory cell device of claim 16 wherein the memory material comprises a Ti-doped GST.

* * * * *